United States Patent
Li et al.

(10) Patent No.: US 11,825,729 B2
(45) Date of Patent: Nov. 21, 2023

(54) TERMINAL DEVICE

(71) Applicants: Chengdu BOE Optoelectronics Technology Co., Ltd., Sichuan (CN); BOE Technology Group Co., Ltd., Beijing (CN)

(72) Inventors: Fan Li, Beijing (CN); Lianbin Liu, Beijing (CN); Bing Gong, Beijing (CN); Huan Meng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 219 days.

(21) Appl. No.: 16/768,915

(22) PCT Filed: Jul. 24, 2019

(86) PCT No.: PCT/CN2019/097468
§ 371 (c)(1),
(2) Date: Jun. 2, 2020

(87) PCT Pub. No.: WO2021/012209
PCT Pub. Date: Jan. 28, 2021

(65) Prior Publication Data
US 2022/0006031 A1  Jan. 6, 2022

(51) Int. Cl.
*G09G 3/32* (2016.01)
*H10K 77/10* (2023.01)
(Continued)

(52) U.S. Cl.
CPC ......... *H10K 77/111* (2023.02); *G09G 3/3225* (2013.01); *H05K 1/189* (2013.01); *G09G 2380/02* (2013.01)

(58) Field of Classification Search
CPC .............. H10K 77/111; H01L 51/0097; H01L 27/3244; G09G 3/3225; G09G 2380/02;
(Continued)

(56) References Cited

U.S. PATENT DOCUMENTS

2007/0222756 A1* 9/2007 Wu ..................... G06F 3/03543
345/165
2008/0084366 A1* 4/2008 Saito ..................... G06F 3/0421
345/55
(Continued)

FOREIGN PATENT DOCUMENTS

CN 101907787 A 12/2010
CN 107346152 A * 11/2017 ........... G06F 1/1601
(Continued)

OTHER PUBLICATIONS

International search report of PCT application No. PCT/CN2019/097468 dated Apr. 15, 2020.

*Primary Examiner* — S M Sohel Imtiaz
(74) *Attorney, Agent, or Firm* — Lippes Mathias LLP

(57) ABSTRACT

Provided is a terminal device, including a photosensitive element, a display panel provided with a light-transmitting region, and a circuit board disposed between the photosensitive element and the display panel and being provided with a light-transmitting hole. The light-transmitting region is a region where light is able to pass through the display panel. The light-transmitting hole is disposed between the photosensitive element and the light-transmitting region of the display panel in a direction perpendicular to a light-exiting surface of the display panel.

18 Claims, 4 Drawing Sheets

(51) Int. Cl.
*G09G 3/3225* (2016.01)
*H05K 1/18* (2006.01)

(58) Field of Classification Search
CPC ... G09G 2300/0426; G09G 3/20; H05K 1/189
See application file for complete search history.

(56) References Cited

U.S. PATENT DOCUMENTS

| | | | |
|---|---|---|---|
| 2011/0260275 A1* | 10/2011 | Cho | H01L 27/14618 |
| | | | 257/E31.127 |
| 2018/0012549 A1* | 1/2018 | Lee | H01L 27/323 |
| 2019/0180665 A1 | 6/2019 | Zhang | |
| 2021/0027703 A1* | 1/2021 | Lin | G09F 9/301 |
| 2021/0035497 A1* | 2/2021 | Toyotaka | H01L 51/5281 |
| 2021/0203818 A1* | 7/2021 | Wang | H04N 5/2257 |

FOREIGN PATENT DOCUMENTS

| | | |
|---|---|---|
| CN | 107346152 A | 11/2017 |
| CN | 108053795 A | 5/2018 |
| CN | 109671728 A | 4/2019 |

\* cited by examiner

TERMINAL DEVICE

CROSS-REFERENCE TO RELATED APPLICATION

The present application is a 371 of PCT Application No. PCT/CN2019/097468, filed on Jul. 24, 2019, the entire contents of which are incorporated herein by reference.

TECHNICAL FIELD

The present disclosure relates to the technical field of terminal, and in particular to a terminal device.

BACKGROUND

A photosensitive element is an important sensing device in a mobile phone, e.g., an infrared sensor, a fingerprint sensor, or a camera. In a full-screen mobile phone, the photosensitive element is usually arranged under the screen, corresponding to the middle or the top of the screen.

SUMMARY

Embodiments of the present disclosure provide a terminal device. The technical solutions are as follows:

At least one embodiment of the present disclosure provides a terminal device. The device includes:

a photosensitive element;

a display panel provided with a light-transmitting region, the light-transmitting region being a region where light is able to pass through the display panel; and a circuit board at least partially disposed between the display panel and the photosensitive element, and covering the light-transmitting region, the circuit board being provided with a light-transmitting hole; the light-transmitting hole being disposed between the photosensitive element and the light-transmitting region of the display panel in a direction perpendicular to a light-exiting surface of the display panel.

Optionally, the light-transmitting element includes a photosensitive portion and an edge portion surrounding the photosensitive portion; wherein the photosensitive portion is configured to receive light that passes through the light-transmitting hole; and an orthographic projection of the photosensitive portion on the display panel falls within an orthographic projection of the light-transmitting hole on the display panel.

Optionally, the circuit board is a chip on glass (COG) circuit board, a chip on film (COF) circuit board, a chip on pi (COP) circuit board, or a flexible printed circuit (FPC).

Optionally, the COF circuit board includes a film circuit board body, and a first inner lead bonding (ILB), a driver integrated circuit (DIC), and a first outer lead bonding (OLB) that are disposed on the film circuit board body, and the light-transmitting hole and the DIC are arranged between the first ILB and the first OLB.

Optionally, the light-transmitting hole is disposed between the DIC and the first ILB.

Optionally, the first ILB of the COF circuit board is electrically connected to the FPC, and the first OLB of the COF circuit board is electrically connected to the display panel.

Optionally, the FPC includes an FPC body, and a second ILB, a device region, a touch bonding region, and a second OLB that are disposed on the FPC body, and the light-transmitting hole, the device region, and the touch bonding region are arranged between the second ILB and the second OLB.

Optionally, the second ILB of the FPC is electrically connected to the COF circuit board, and the second OLB of the FPC is electrically connected to a mainboard of the terminal device.

Optionally, the photosensitive element is a fingerprint sensor, an infrared sensor, or a camera.

Optionally, the photosensitive element is a fingerprint sensor or a camera, and the light-transmitting region is a light-transmitting region through which visible light is able to pass; or the photosensitive element is an infrared sensor, and the light-transmitting region is a light-transmitting region through which infrared light is able to pass.

Optionally, the light-transmitting region is disposed within a bottom region of the display panel, and one side edge of the bottom region is a bottom edge of the display panel.

Optionally, the bottom region is disposed within a display region of the display panel.

Optionally, the terminal device further includes a support disposed between the circuit board and the photosensitive element, the support being provided with a first through hole communicated with the light-transmitting hole.

Optionally, a material of the support is foam.

Optionally, the photosensitive element includes a base and a photosensitive module; the base is secured onto a rear case of the terminal device; the photosensitive module is secured onto the base; the support is arranged on the base; and the photosensitive module is arranged in the first through hole of the support.

Optionally, the terminal device further includes a protective film disposed between the display panel and the circuit board, the protective film being provided with a second through hole communicated with the light-transmitting hole.

Optionally, the protective film includes foam and a copper foil, the foam is arranged between the copper foil and the display panel, and the copper foil is arranged between the foam and the circuit board.

Optionally, an area of the first through hole is larger than an area of the light-transmitting hole, and the area of the light-transmitting hole is larger than an area of the second through hole.

Optionally, the light-transmitting hole is in a circular or a rectangular shape.

Optionally, the light-transmitting hole is in a circular shape, a diameter of the circular shape ranging from about 6 mm to 8 mm; or the light-transmitting hole is in a rectangular shape, a side length of the rectangular shape ranging from about 6 mm to 8 mm.

Optionally, the light-transmitting hole is fabricated by punching or laser cutting.

Optionally, the display panel is an organic light-emitting diode (OLED) display panel.

DETAILED DESCRIPTION

For clearer descriptions of the objects, technical solutions and advantages in the embodiments of the present disclosure, the present disclosure is described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

Generally, in a full-screen mobile phone, it is impossible to arrange a photosensitive element since there is a circuit board at the bottom of the screen. However, some photosensitive elements, for example, a fingerprint sensor, need to be arranged at the bottom. If these photosensitive elements are arranged at the middle or the top of the screen, it is inconvenient for a user to perform a fingerprint touch operation.

Figure 1:
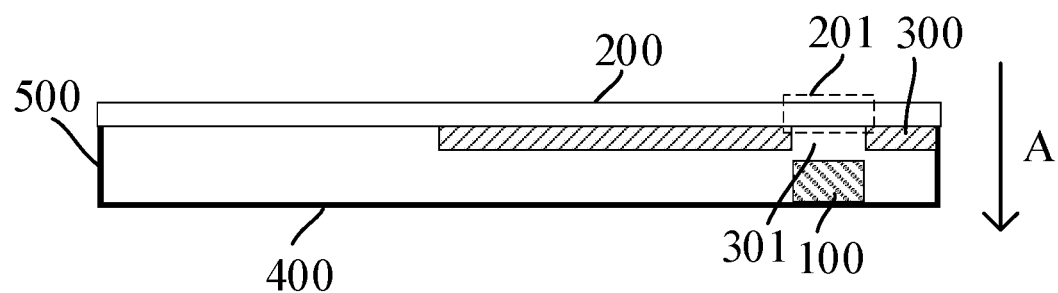
FIG. 1 is a schematic structural diagram of a terminal device according to an embodiment of the present disclosure.

FIG. 1 is a schematic structural diagram of a terminal device according to an embodiment of the present disclosure. Referring to FIG. 1, the terminal device includes a photosensitive element 100, a display panel 200 and a circuit board 300. The circuit board 300 is at least partially disposed between the display panel 200 and the photosensitive element 100 and covers a light-transmitting region 201.

As shown in FIG. 1, the display panel 200 is provided with a light-transmitting region 201. The circuit board 300 is provided with a light-transmitting hole 301. The light-transmitting hole 301 is disposed between the photosensitive element 100 and the light-transmitting region 201 of the display panel 200 in a direction A perpendicular to a light-exiting surface of the display panel 200.

Herein, the light-transmitting region 201 is a region through which light passes through the display panel 200. The light-exiting surface of the display panel 200 is a surface from which light is emitted, of the display panel. A user may view a picture displayed on the display panel over the surface.

In the terminal device, for example, a full-screen mobile phone, the photosensitive element is arranged under the display panel. In this case, the light-transmitting hole is defined through the circuit board for the photosensitive element to transmit and receive a light signal, such that the photosensitive element may be arranged in a region, provided with the circuit board, of the terminal device. For example, the photosensitive element is arranged corresponding to the bottom of a screen of the terminal device to avoid inconvenience caused by arranging the photosensitive element (for example, a fingerprint sensor) corresponding to the middle or the top of the screen. Meanwhile, since the photosensitive element is disposed under the screen, it is unnecessary to define a hole through the screen. Therefore, the screen-to-body ratio is increased, and a bezel is reduced.

The light-transmitting region 201 is a portion of the display panel 200 that can transmit light. For example, the light-transmitting region 201 may be a part of a display region, and this part may be used for display and simultaneously for light to pass through. The light-transmitting region 201 may also be a part of a non-display region as long as light is able to pass through.

As shown in FIG. 1, an area of the light-transmitting region 201 may be larger than an area of the light-transmitting hole 301, which ensures that the light signal of the photosensitive element 100 can pass smoothly, and at the same time, facilitates alignment and assembly of the light-transmitting hole 301 with the light-transmitting region 201.

The terminal device referred to in the embodiments of the present disclosure may be the aforementioned mobile phone. In addition, the terminal device may also be other terminal devices, such as, a tablet computer and a smart watch. Any terminal device that has a display panel, a circuit board, and a photosensitive element can use the solution of the present disclosure.

Optionally, the photosensitive element 100 may be a fingerprint sensor (FPS), an infrared sensor or a camera. Since the circuit board is usually disposed proximal to the lower end of the screen of the terminal device, the photosensitive element here is usually a fingerprint sensor, which facilitates user's touch operations. Of course, the photosensitive element may also be an infrared sensor or a camera.

The fingerprint sensors include an optical fingerprint sensor, an ultrasonic fingerprint sensor, a capacitive fingerprint sensor and the like. Because neither the ultrasonic fingerprint sensor nor the capacitive fingerprint sensor utilizes the optical principle, both of the sensors is capable of operating even if the sensors are installed under the screen and provided with no light-transmitting holes. Therefore, the fingerprint sensor referred to in the present disclosure is an optical fingerprint sensor.

In the embodiments of the present disclosure, for different photosensitive elements 100, light to be transmitted through the light-transmitting region 201 on the display panel 200 is also different. For example, when the photosensitive element 100 is a fingerprint sensor or a camera, the light-transmitting region 201 is a light-transmitting region through which visible light is able to pass, and the light-transmitting region 201 needs to have the ability to transmit visible light, so as to ensure normal operation of the fingerprint sensor or the camera. However, when the photosensitive element 100 is an infrared sensor, the light-transmitting region 201 is a light-transmitting region through which infrared light is able to pass, and the light-transmitting region 201 only needs to have the ability to transmit infrared light.

Exemplarily, the display panel may be an organic light-emitting diode (OLED) display panel. The OLED display panel is easily fabricated into a light-transmitting display panel, such that the use of the OLED display panel facilitates design of the aforementioned light-transmitting region 201. The display panel may also be a liquid crystal display panel, a micro light-emitting diode display panel, or other types of display panels.

The OLED display panels include an active matrix OLED (AMOLED) display panel and a passive matrix OLED (PMOLED) display panel. In the AMOLED display panel, the area of circuit board is a larger area, as a driving circuit is more complicated. Thus, the solution is more suitable for the AMOLED display panel.

Referring to FIG. 1, in the terminal device, the display panel 200, a rear case 400, and a bezel 500 form a confined space, and the photosensitive element 100 and the circuit board 300 are both arranged in the confined space. Exemplarily, the photosensitive element 100 may be directly mounted on the rear case 400, for example, by bolts or other fasteners, or glued to the rear case 400 by an adhesive or the like. However, the circuit board 300 is adhered to the display panel 200 by an adhesive.

Exemplarily, the circuit board 300 may be a chip on glass (COG) circuit board, a chip on film (COF) circuit board, a chip on pi (COP) circuit board, or a flexible printed circuit (FPC), which are all common circuit boards in such terminal devices as a mobile phone. By defining holes through these circuit boards, normal transmission of the light signal of the photosensitive element can be achieved.

Herein, COG, COF, and COP are three circuit package modes, and one of them is usually used in the terminal device to bond to the display panel and the FPC. In the three circuit package modes, although circuit structures are different, positions, shapes, sizes, and the like of the light-transmitting holes defined through may adopt the same design. In order to facilitate understandings, the COF circuit board is taken as an example for explanation in the followings.

The structures of the COF circuit board and the FPC provided with light-transmitting holes is described below with reference to the accompanying drawings.

Figure 2:
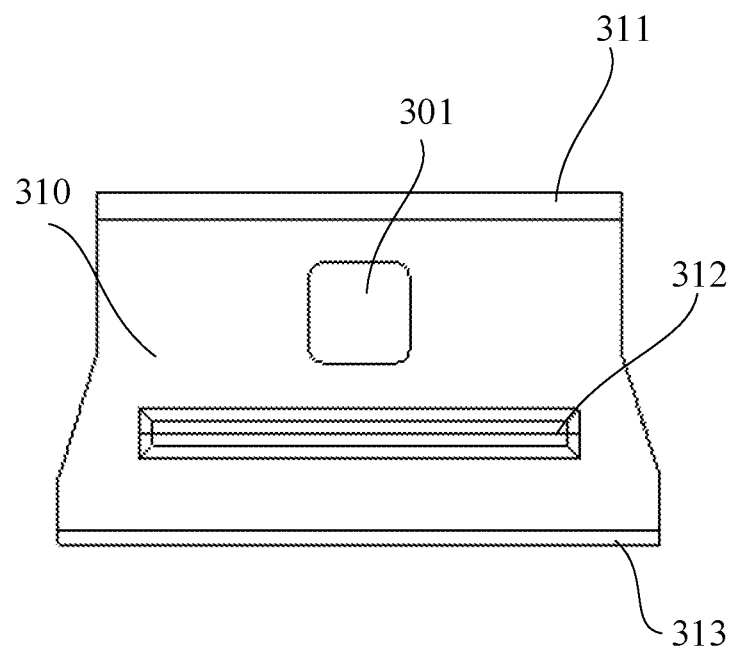
FIG. 2 is a schematic structural diagram of a COF circuit board according to an embodiment of the present disclosure.

FIG. 2 is a schematic structural diagram of a COF circuit board according to an embodiment of the present disclosure. Referring to FIG. 2, the COF circuit board includes a film circuit board body 310, namely, a COF film, and a light-transmitting hole 301 is defined through the middle of the COF film.

The COF circuit board further includes a first inner lead bonding (ILB) 311, a driver integrated circuit (DIC) 312, and a first outer lead bonding (OLB) 313 that are disposed on the film circuit board body 310. The light-transmitting hole 301 and the DIC 312 are arranged between the first ILB 311 and the first OLB 313. The first ILB 311 is configured to be electrically connected with the FPC, and the first OLB 313 is configured to be electrically connected with a circuit bonding region of the display panel 200.

Exemplarily, the light-transmitting hole 301 is disposed between the DIC 312 and the first ILB 311.

Figure 3:
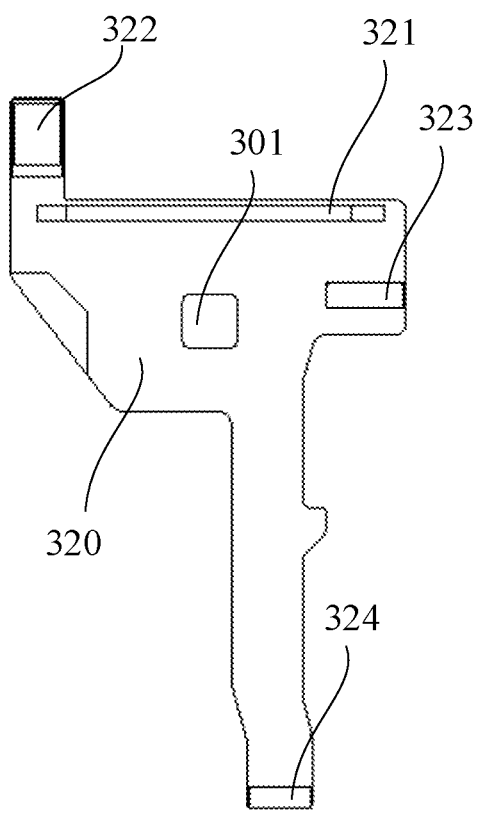
FIG. 3 is a schematic structural diagram of an FPC according to an embodiment of the present disclosure.

FIG. 3 is a schematic structural diagram of an FPC according to an embodiment of the present disclosure. Referring to FIG. 3, the FPC is described by taking a main FPC (MFPC) as an example. The FPC includes a flexible printed circuit body 320, namely, an FPC film, and a light-transmitting hole 301 is defined through the middle of the FPC film.

The FPC further includes a second ILB 321, a device region 322, a touch binding region 323 and a second OLB 324 that are disposed on the flexible printed circuit body 320. The light-transmitting hole 301, the device region 322, and the touch bonding region 323 are arranged between the second ILB 321 and the second OLB 324. The second ILB 321 is configured to be electrically connected with the COF circuit board, and the second OLB 324 is configured to be electrically connected with a mainboard of the terminal device. The device region 322, namely, a component region, integrates such components as a capacitor and a memory. The touch bonding region 323 is configured to be bonded to a touch circuit of the display panel.

The light-transmitting holes 301 in FIG. 2 and FIG. 3 may be fabricated by punching or laser cutting. Exemplarily, during design of the COF circuit board or the FPC, a region where a light-transmitting hole is defined is reserved without traces. After fabrication of the circuit board is finished, the above-mentioned process is adopted to define the light-transmitting hole. It is easy to define the light-transmitting hole through the circuit board by use of these two processes.

Exemplarily, the light-transmitting hole 301 generally is in a circular or a rectangular shape. The light-transmitting hole is designed into a conventional shape to facilitate the design and production. For example, the light-transmitting holes 301 in FIG. 2 and FIG. 3 are in a square shape (having rounded corners). In other embodiments, the light-transmitting hole 301 may be also in other regular or irregular shapes.

In the embodiments of the present disclosure, the light-transmitting hole 301 is in a circular shape, a diameter of the circular shape ranging from about 6 mm to 8 mm; or the light-transmitting hole 301 is in a rectangular shape, a side length of the rectangular shape ranging from about 6 mm to 8 mm. The light-transmitting hole of this size can meet a light-transmitting requirement of common photosensitive elements in the terminal device. Exemplarily, the diameter of the circular shape or the side length of the rectangular shape may be 6 mm.

The light-transmitting hole designed in this size can meet the light-transmitting requirement of one photosensitive element. In addition, under normal circumstances, only one light-transmitting hole is designed through the circuit board of the terminal device, and this light-transmitting hole is defined through the COF circuit board or the FPC. Thus, trace cannot be adversely affected by defining too many through holes through the circuit board.

Figure 4:
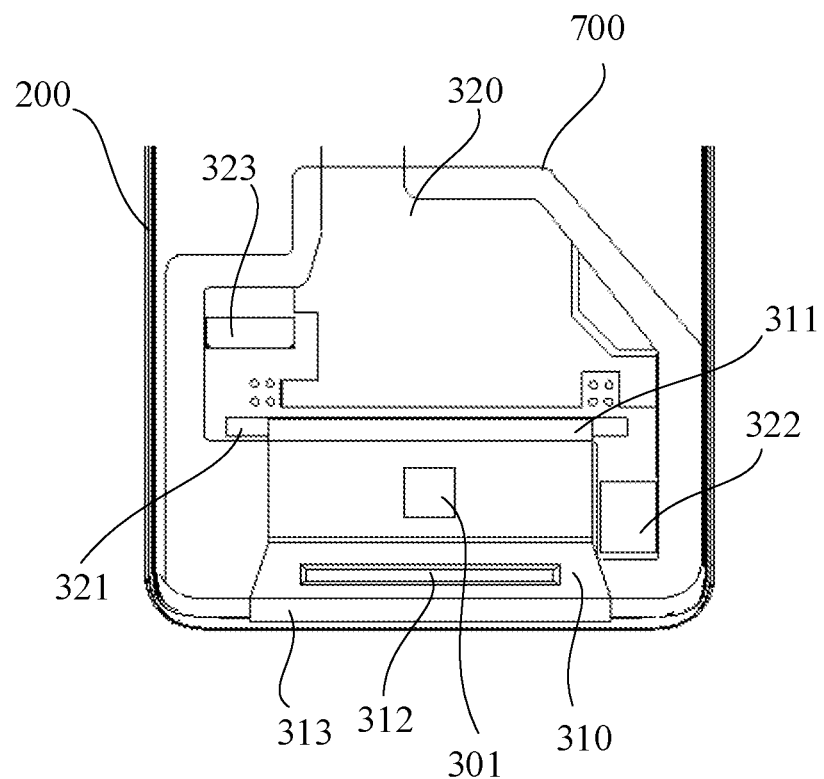
FIG. 4 is a schematic diagram showing an internal structure of a terminal device according to an embodiment of the present disclosure.

FIG. 4 is a schematic diagram showing an internal structure of a terminal device according to an embodiment of the present disclosure. Referring to FIG. 4, the first OLB 313 of the COF circuit board is bonded to the display panel 200, and the first ILB 311 of the COF circuit board is bonded to the second ILB 321 of the FPC. Since the light-transmitting hole 301 is defined through the COF circuit board which is more proximal to a lower bezel of the terminal device, the user can touch such photosensitive elements as a fingerprint sensor more conveniently if they are arranged.

Figure 5:
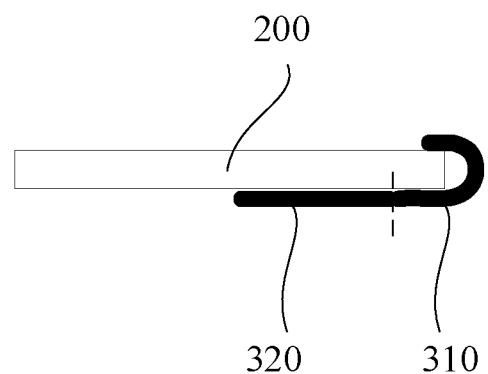
FIG. 5 is a schematic diagram showing bonding of a display panel to a COF circuit board according to an embodiment of the present disclosure.

Herein, the COF circuit board is bonded to the bonding region of the display panel 200 and is reflexed to be under the display panel 200 after being bonded to display panel 200. FIG. 5 is a schematic diagram showing binding of the display panel 200 to the COF circuit board according to an embodiment of the present disclosure. As shown in FIG. 5, the COF circuit board (only the film circuit board body 310 of the COF circuit board is shown in the figure) and the display panel 200 are bonded in the bonding region of the display panel 200, and the bonding region is disposed at an edge of the display panel 200. The COF circuit board may be in line with the display panel when bonded to the display panel 200 and is bent after being bonded so as to be reflexed to be under the display panel. After that, the COF circuit board is bonded to the FPC (only the flexible printed circuit body 320 of the FPC is shown in the figure). After reflexing and binding shown in FIG. 5 are completed, the COF circuit board and the FPC may be adhered to the display panel by an adhesive, realizing securing of the COF circuit board and the FPC.

However, if two or more photosensitive elements need to be arranged in a corresponding region of the circuit board, the number of light-transmitting holes 301 may be designed as required. For example, according to the number of photosensitive elements, it is designed that each photosensitive element is correspondingly arranged with one light-transmitting hole. For example, the number of light-transmitting holes is smaller than the number of photosensitive elements, there may be the case that two or more photosensitive elements share one light-transmitting hole, and the size of the common light-transmitting hole can meet light-transmitting requirements of the photosensitive elements sharing the light-transmitting hole.

Figure 6:
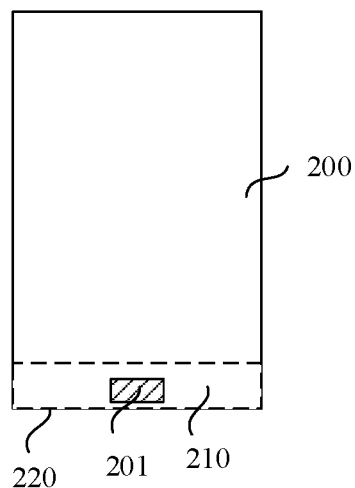
FIG. 6 is a schematic structural diagram of a display panel according to an embodiment of the present disclosure.

FIG. 6 is a schematic structural diagram of a display panel according to an embodiment of the present disclosure. Referring to FIG. 6, the light-transmitting region 201 is disposed in a bottom region 210 of the display panel 200, and one side edge of the bottom region 210 is a bottom edge 220 of the display panel 200. The light-transmitting hole 301 is defined on the circuit board 300 proximal to the bottom edge of the display panel 200, which facilitates arrangement of such photosensitive elements as a fingerprint sensor.

Herein, the bottom edge 220 of the display panel may be an edge proximal to the last row of scanned pixels in a scanning direction of the display panel. On the terminal device, the bottom edge is proximal to the lower bezel of the terminal device.

Exemplarily, the bottom region 210 may be disposed within the display region of the display panel 200. For a full-screen terminal device, the entire screen is the display region. In this case, the only requirement is to design the display region into a transparent display region. For a non-full-screen terminal device, the bottom region may also be a non-display region, for example, a bezel region. At this time, it is necessary to dispose one light-transmitting region in the non-display region to transmit light required by the photosensitive element 100.

Figure 7:
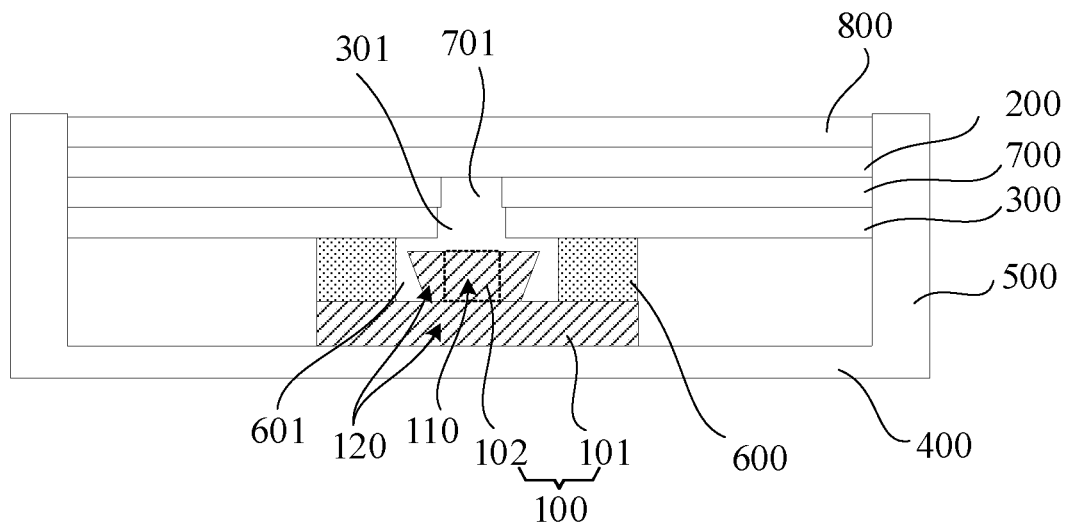
FIG. 7 is a schematic diagram showing an internal structure of a terminal device according to an embodiment of the present disclosure.

FIG. 7 is a schematic diagram showing an internal structure of a terminal device according to an embodiment of the present disclosure. Referring to FIG. 7, the terminal device further includes a support 600 disposed between the circuit board 300 and the photosensitive element 100. The support 300 has a first through hole 601 communicated with the light-transmitting hole 301. By arranging the support 600, on the one hand, it may play the role of further fixing the photosensitive element 100 and the circuit board 300, and on the other hand, it may shield light incident from a side edge into the photosensitive element 100, to ensure that the light signal is transmitted through the light-transmitting hole 301 and to avoid signal interference.

Exemplarily, a material of the support 600 is foam. The foam has favorable light-shielding properties, and at the same time, owing to its certain elasticity, it may also play a shock-absorbing role in the event of a collision.

As shown in FIG. 7 the photosensitive element 100 has a base 101 and a photosensitive module 102. The base 101 is secured onto the rear case 400. The photosensitive module 102 is secured onto the base 101. The support 600 is arranged on the base 101. The photosensitive module 102 may be arranged in the first through hole 601 of the support 600. In this way, it can be ensured that the light signal of the photosensitive module 102 is transmitted through the light-transmitting hole 301.

As shown in FIG. 7, the photosensitive element 100 includes a photosensitive portion 110 and an edge portion 120 surrounding the photosensitive portion 110. The photosensitive portion 110 is configured to receive light passing through the light-transmitting hole 301, for example, a lens of a camera. An orthographic projection of the photosensitive portion 110 on the display panel 200 falls within an orthographic projection of the light-transmitting hole 301 on the display panel 200. Herein, the orthographic projection of the photosensitive portion on the display panel 200 falls within the orthographic projection of the light-transmitting hole 301 on the display panel 200 means that these two projections are completely overlapped with each other, or the orthographic projection of the photosensitive portion on the display panel 200 is wrapped by the orthographic projection of the light-transmitting hole 301 on the display panel 200.

Owing to the above definition of the projected areas, it can be ensured that the light emitted or received by the photosensitive element 100 passes through the light-transmitting hole 301 smoothly.

As shown in FIG. 7, the photosensitive portion 110 is disposed on the photosensitive module 102 of the photosensitive element 100, and is a light-transmitting portion (the dashed-line box portion in FIG. 6) on the photosensitive module 100. A housing of the photosensitive module 102 and the base 101 of the photosensitive module 102 are edge portions 120 surrounding the photosensitive portion 110.

As an implementation of the embodiments of the present disclosure, referring to FIG. 4 and FIG. 6, the terminal device further includes a protective film 700 disposed between the display panel 200 and the circuit board 300. The protective film 700 is provided with a second through hole 701 communicated with the light-transmitting hole 301. The through hole is defined through the protective film 700 to ensure that the light signal is able to pass through the photosensitive element 100.

In the embodiments of the present disclosure, the protective film 700 plays the roles of buffering and heat dissipation. In addition, the protective film 700 is arranged between the display panel 200 and the circuit board 300, and may play a buffering role in the event of a collision. Furthermore, an edge of the protective film 700 is connected to a bezel 500, such that heat produced by the display panel 200 and the circuit board 300 may be transferred outside to realize heat dissipation.

Figure 8:
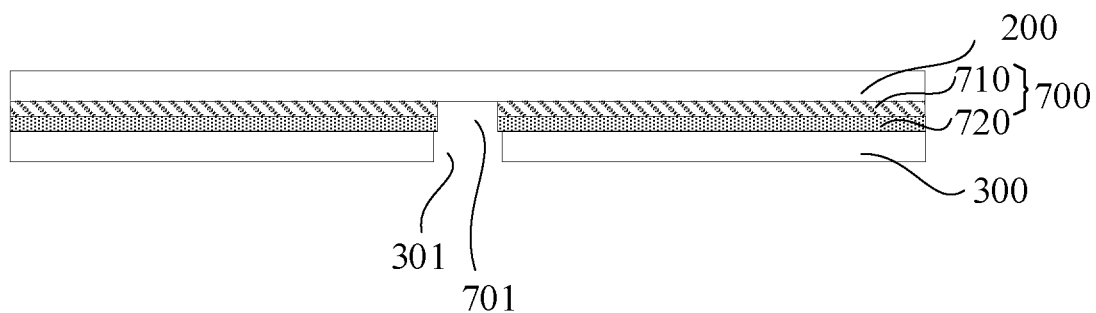
FIG. 8 is a schematic structural diagram of a protective film according to an embodiment of the present disclosure.

FIG. 8 is a schematic structural diagram of a protective film according to an embodiment of the present disclosure. Referring to FIG. 8, the protective film 700 may include foam 710 and a copper foil 720. The foam 710 is disposed between the copper foil 720 and the display panel 200, and the copper foil 720 is disposed between the foam 710 and the circuit board 300.

For example, the foam 710 is adhered to the display panel 200 and the copper foil 720, and the copper foil 720 is adhered to the circuit board 300.

Exemplarily, the foam 710 and the display panel 200, the foam 710 and the copper foil 720, and the copper foil 720 and the circuit board 300 may be adhered by a glue.

In the protective film 700, both the foam 710 and the copper foil 720 are provided with the second through hole 701 as described above.

Due to the presence of the protective film 700, the circuit board 300 is actually adhered to the protective film 700 by a glue. Exemplarily, the circuit board 300 is adhered to the copper foil by a glue.

As shown in FIG. 7, an area of the light-transmitting hole 301 may be larger than an area of the second through hole 701. In this way, during installation of the circuit board 300, the whole second through hole 701 can be seen through the light-transmitting hole 301, which is convenient to align the light-transmitting hole 301 with the second through hole 701. Similarly, an area of the first through hole 601 may be larger than the area of the light-transmitting hole 301.

In other implementations, the area of the light-transmitting hole 301 may be equal to or smaller than the area of the second through hole 701, so long as the sizes of the light-transmitting hole and the second through hole can meet a light signal transmission requirement of the photosensitive element.

Referring to FIG. 6 again, the terminal device further includes a transparent cover plate 800, which fits the light-exiting surface of the display panel 200 and is configured to protect the display panel 200. The transparent cover plate 800 is generally a glass cover plate.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as exemplary only, and the true scope and spirit of the present disclosure are indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:

1. A terminal device, comprising:
   a photosensitive element;
   a display panel provided with a light-transmitting region, the light-transmitting region being a region where light is able to pass through the display panel; and
   a circuit board at least partially disposed between the display panel and the photosensitive element, wherein the circuit board is provided with a light-transmitting hole and is a circuit board of the terminal device;
   wherein the light-transmitting hole is disposed between the photosensitive element and the light-transmitting region of the display panel in a direction perpendicular to a light-exiting surface of the display panel.

2. The terminal device according to claim 1, wherein the photosensitive element comprises a photosensitive portion and an edge portion surrounding the photosensitive portion; wherein
   the photosensitive portion is configured to receive light that passes through the light-transmitting hole; and
   an orthographic projection of the photosensitive portion on the display panel falls within an orthographic projection of the light-transmitting hole on the display panel.

3. The terminal device according to claim 1, wherein the circuit board is a chip on glass (COG) circuit board, a chip on film (COF) circuit board, a chip on pi (COP) circuit board, or a flexible printed circuit (FPC).

4. The terminal device according to claim 3, wherein the COF circuit board comprises a film circuit board body, and a first inner lead bonding (ILB), a driver integrated circuit (DIC), and a first outer lead bonding (OLB) that are disposed on the film circuit board body, and the light-transmitting hole and the DIC are arranged between the first ILB and the first OLB.

5. The terminal device according to claim 4, wherein the light-transmitting hole is disposed between the DIC and the first ILB.

6. The terminal device according to claim 3, wherein the FPC comprises an FPC body, and a second inner lead bonding (ILB), a device region, a touch bonding region, and a second outer lead bonding (OLB) that are disposed on the FPC body, and the light-transmitting hole, the device region and the touch bonding region are arranged between the second ILB and the second OLB.

7. The terminal according to claim 1, wherein the photosensitive element is a fingerprint sensor, an infrared sensor, or a camera.

8. The terminal device according to claim 7, wherein the photosensitive element is a fingerprint sensor or a camera, and the light-transmitting region is a light-transmitting region through which visible light is able to pass; or
   the photosensitive element is an infrared sensor, and the light-transmitting region is a light-transmitting region through which infrared light is able to pass.

9. The terminal device according to claim 1, wherein the light-transmitting region is disposed within a bottom region of the display panel, and one side edge of the bottom region is a bottom edge of the display panel.

10. The terminal device according to claim 9, wherein the bottom region is disposed within a display region of the display panel.

11. The terminal device according to claim 1, further comprising a support disposed between the circuit board and the photosensitive element, the support being provided a first through hole communicated with the light-transmitting hole.

12. The terminal device according to claim 11, wherein a material of the support is foam.

13. The terminal device according to claim 11, wherein the photosensitive element comprises a base and a photosensitive module; the base is secured onto a rear case of the terminal device; the photosensitive module is secured onto the base; the support is arranged on the base; and the photosensitive module is arranged in the first through hole of the support.

14. The terminal device according to claim 11, further comprising a protective film disposed between the display panel and the circuit board, the protective film being provided with a second through hole communicated with the light-transmitting hole.

15. The terminal device according to claim 14, wherein the protective film comprises foam and a copper foil, the foam is arranged between the copper foil and the display panel, and the copper foil is arranged between the foam and the circuit board.

16. The terminal device according to claim 14, wherein an area of the first through hole is larger than an area of the light-transmitting hole, and the area of the light-transmitting hole is larger than an area of the second through hole.

17. The terminal device according to claim 1, wherein the light-transmitting hole is in a circular or a rectangular shape.

18. The terminal device according to claim 1, wherein the display panel is an organic light-emitting diode (OLED) display panel.

* * * * *